US007206652B2

(12) United States Patent
Burda et al.

(10) Patent No.: US 7,206,652 B2
(45) Date of Patent: Apr. 17, 2007

(54) METHOD AND SYSTEM FOR INTELLIGENT AUTOMATED RETICLE MANAGEMENT

(75) Inventors: Richard G. Burda, Pleasant Valley, NY (US); Alfred Degbotse, Colchester, VT (US); Brian T Denton, Winooski, VT (US); Kenneth J. Fordyce, Hurley, NY (US); Robert J. Milne, Jericho, VT (US); Sameer T. Shikalgar, Wappingers Falls, NY (US); Guogang Zuo, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 10/711,079

(22) Filed: Aug. 20, 2004

(65) Prior Publication Data

US 2006/0052889 A1 Mar. 9, 2006

(51) Int. Cl.
*G06F 19/00* (2006.01)
(52) U.S. Cl. ......................................... 700/96; 700/121
(58) Field of Classification Search .................. 700/96, 700/121, 99
See application file for complete search history.

(56) References Cited

U.S. PATENT DOCUMENTS

| 4,796,194 | A | 1/1989 | Atherton |
| 5,841,660 | A | 11/1998 | Robinson et al. |
| 6,457,587 | B1 * | 10/2002 | Conboy et al. ............. 209/630 |
| 6,517,304 | B1 * | 2/2003 | Matsumoto ................. 414/217 |
| 6,564,113 | B1 | 5/2003 | Barto et al. |
| 6,615,098 | B1 | 9/2003 | Bode et al. |
| 6,640,151 | B1 | 10/2003 | Somekh et al. |
| 6,930,762 | B2 * | 8/2005 | Yamada ...................... 700/121 |
| 7,058,627 | B2 * | 6/2006 | Wiesler et al. .................. 707/5 |
| 2002/0156548 | A1 | 10/2002 | Arackaparambil et al. |
| 2004/0017556 | A1 * | 1/2004 | Nakahara ...................... 355/70 |
| 2005/0090925 | A1 * | 4/2005 | Albrecht et al. ............. 700/121 |
| 2005/0216117 | A1 * | 9/2005 | Lee et al. .................... 700/215 |

OTHER PUBLICATIONS

Nadoli, et al, "Simulation in Automated Material Handling Systems Design for Semiconductor Manufacturing", Proceedings of the 1994 Winter Simulation Conference, pp. 892-899.

(Continued)

*Primary Examiner*—Leo Picard
*Assistant Examiner*—Steven R. Garland
(74) *Attorney, Agent, or Firm*—Gibb I.P. Law Firm, LLC; Anthony Canale

(57) ABSTRACT

A method, system, and program storage device for implementing the method of controlling a manufacturing system, wherein the method comprises providing a plurality of workpieces to be processed on a processing tool, the plurality of workpieces located at processing stations prior to the processing tool, determining auxiliary equipment allocation needs for the processing tool based on characteristics associated with the plurality of workpieces prior to the workpieces arriving at the processing tool, and sending auxiliary equipment to the processing tool based on the allocation needs prior to the workpieces arriving at the processing tool. According to an embodiment of the invention, the processing tool comprises a photolithographic system, the auxiliary equipment comprises a reticle, and the plurality of workpieces comprise semiconductor substrates.

37 Claims, 11 Drawing Sheets

OTHER PUBLICATIONS

Park, et al., "Assessment of Potential Gains in Productivity Due to Proactive Reticle Management Using Discrete Event Simulation", Proceedings of the 1999 Winter Simulation Conference, pp. 856-864.

Campbell, et al., "A Model of a 300MM Wafer Fabrication Line", Proceddings of the 1999 Winter Simulation Conference, pp. 909-911.

Lee, et al., "Dispatching Heuristic for Wafer Fabricaiton", Proceedings of the 2001 Winter Simulation Conference, pp. 1215-1219.

White, Jr., et al., "Operational Simulation of an X-Ray Lithography Cell: Comparison of 200MM and 300MM Wafers", Proceedings of the 1999 Winter Simulation Conference, pp. 865-874.

Pierce, et al., "Modeling and Simulation of Material Handling for Semiconductor Wafer Fabrication", Proceedings of the 1994 Winter Simulation Conference, pp. 900-906.

Robinson, et al., "Capacity Planning for Semiconductor Wafer Fabrication With Time Constraints Between Operations", Proceedings of the 1999 Winter Simulaiton Conference, pp. 880-887.

* cited by examiner

METHOD AND SYSTEM FOR INTELLIGENT AUTOMATED RETICLE MANAGEMENT

BACKGROUND ART

1. Field of the Invention

The embodiments of the invention generally relate to automated manufacturing process control, and more particularly to modeling a manufacturing system through intelligent automated reticle management.

2. Description of the Related Art

Semiconductor manufacturing involves several hundred detailed and complex processes, which must be skillfully coordinated according to stringent fabrication schedules. Semiconductor manufacturing processes may include photolithography processes, etching processes, deposition processes, polishing processes, rapid thermal processes, implantation processes, annealing processes, among others. As such, specific machines and tools are required to perform the above-mentioned processes according to defined manufacturing rules.

One of the individual processes creating significant bottlenecks in the overall manufacturing process is the photolithography process. While solutions exist to aid in improving the efficiency of the photolithography process, there remain delays associated with the scheduling of auxiliary equipment called reticles (Park, S. et al., "Assessment of Potential Gains in Productivity Due to Proactive Reticle Management Using Discrete Event Simulation," Proceedings of the 1999 Winter Simulation Conference, eds. Farrington, P. A., Nembhard, H. B., Sturrock, D. T., and Evans, G. W., pp. 856–864, the complete disclosure of which is herein incorporated by reference).

Reticles are auxiliary devices that are used for projecting complex circuit patterns onto the surface of a wafer by way of a photolithographic process. As such, reticles are components associated with the machines or tools used in the specific manufacturing processes, and thus different reticles must be allocated to machines or tools depending on the manufacturing process to be carried out. Moreover, there may be several reticles that could be allocated to one particular machine or tool at a given time, and hence there is a need to optimize reticle management decisions.

Computerized simulations exist to provide modeling guidelines for identifying bottlenecks in a manufacturing process and for simulating solutions to predict and mitigate these bottlenecks, wherein some of these simulations focus on automated material handling systems (AMHS), which evaluate work-in-process (WIP) projections of workpiece lots through the manufacturing process (Nadoli, G. et al., "Simulation in Automated Material Handling Systems Design for Semiconductor Manufacturing," Proceedings of the 1994 Winter Simulation Conference, eds. Tew, J. D., Manivannan, S., Sadowski, D. A., and Seila, A. F., pp. 892–899, the complete disclosure of which is herein incorporated by reference). Moreover, a productive manufacturing process may be defined by, among other factors, product throughput, which is the rate at which the process produces product output.

Because of the complexities involved in semiconductor manufacturing, there remains a need for improving and controlling the manufacturing process. Moreover, improved modeling techniques are needed to better address issues such as reticle dispatching to relieve bottlenecks which impact manufacturing efficiency.

SUMMARY OF THE INVENTION

In view of the foregoing, an embodiment of the invention provides a method (and a program storage device implementing the method) of controlling a manufacturing system, wherein the method comprises providing at least one processing tool and at least one set of auxiliary equipment, supplying a plurality of workpieces to be processed on the processing tool, and determining, from characteristics associated with the processing tool and the plurality of workpieces, an order of arrival of the auxiliary equipment to arrive at the processing tool. In the step of providing, the processing tool comprises a photolithographic system and the auxiliary equipment comprises a reticle.

The method further comprises modeling future events related to the processing tool based on work-in-process profiles generated from an iteration of the method. Additionally, in the step of the supplying, the plurality of workpieces comprise semiconductor wafers, and the characteristics associated with the plurality of workpieces comprise work lot priorities, processing times, auxiliary equipment handling system bandwidth, lot priorities of forecasted lots, and pod availability. Moreover, the step of determining comprises ranking the auxiliary equipment in terms of expected arrival times to the processing tool. The method further comprises modeling future events related to the processing tool based on work-in-process projections.

Another aspect of the invention provides a method of controlling a manufacturing system, wherein the method comprises providing a plurality of workpieces to be processed on a processing tool, wherein the plurality of workpieces being located at processing stations prior to the processing tool, determining auxiliary equipment allocation needs for the processing tool based on characteristics associated with the plurality of workpieces prior to the workpieces arriving at the processing tool, and sending auxiliary equipment to the processing tool based on the allocation needs prior to the workpieces arriving at the processing tool, wherein in the step of providing, the processing tool comprises a photolithographic system, and wherein in the step of determining, the auxiliary equipment comprises a reticle.

Moreover, in the step of providing, the plurality of workpieces comprise semiconductor wafers. Also, the characteristics associated with the plurality of workpieces comprise work lot priorities, processing times, auxiliary equipment handling system bandwidth, lot priorities of forecasted lots, and pod availability. Furthermore, the step of determining comprises ranking the workpieces in terms of expected arrival times to the processing tool. The method further comprises modeling future events related to the processing tool based on work-in-process projections.

Another embodiment of the invention provides a system for controlling a manufacturing process comprising a processing tool configured for processing a plurality of workpieces; a processing station comprising the plurality of workpieces, wherein a location of the processing station precedes a location of the processing tool; an analyzer configured for determining, from characteristics associated with the plurality of workpieces, an order of arrival of a first of the workpieces to arrive at the processing tool; and a controller configured for providing auxiliary equipment corresponding to the first workpieces to the processing tool prior to the arrival of the first workpieces to the processing tool.

According to the system, the processing tool comprises a photolithographic system, the auxiliary equipment comprises a reticle, the plurality of workpieces comprise semiconductor wafers, and the characteristics associated with the plurality of workpieces comprise work lot priorities, processing times, auxiliary equipment handling system bandwidth, lot priorities of forecasted lots, and pod availability. Additionally, the analyzer is configured for ranking the workpieces in terms of expected arrival times to the processing tool. The system further comprises a modeling generator configured for modeling future events related to the processing tool based on work-in-process projections generated from the analyzer.

Another aspect of the invention provides a method of inspecting auxiliary equipment in a manufacturing process, wherein the method comprises creating a list of potential auxiliary equipment for inspection, designating the potential auxiliary equipment according to inspection requirements, and prioritizing the potential auxiliary equipment according to a set of defined rules, wherein in the step of creating, the auxiliary equipment comprises a reticle, and wherein the creation of the list comprises categorizing the reticles into groups including a first set comprising reticles associated with a dispatchable wafer lot, a second set comprising reticles associated with work-in-process projections, and a third set comprising reticles other than reticles in the first and second sets.

According to the method, the inspection requirements comprise warning limits and inhibit limits associated with inspecting the auxiliary equipment, and the set of defined rules comprises specified designations including any of dispatchable wafer lot and the inhibit limits categorizations, dispatchable wafer lots and the warning limits categorizations, work-in-process projections within a specified time window and the inhibit limits categorizations, and work-in-process projections within a specified time window and the warning limits categorizations. The method further comprises re-prioritizing the prioritized potential reticles into a re-prioritized list based on a second set of defined rules, and removing duplicate reticles from the re-prioritized list, wherein the second set of defined rules comprises prioritization rules and projected work-in-process arrival times.

Additionally, the method further comprises determining candidate reticles to kit and unkit based on any of reticle requirements for dispatchable wafer lots, high volume wafer lot types, and forecasted upstream wafer lot arrivals, and prioritizing kitting and unkitting actions based on any of wafer lot priority, forecasted upstream wafer lot priority, pod availability, and reticle handling system bandwidth.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

DESCRIPTION OF DRAWINGS

The embodiments of the invention will be better understood from the following detailed description with reference to the drawings, in which.

DISCLOSURE

Figure 1:
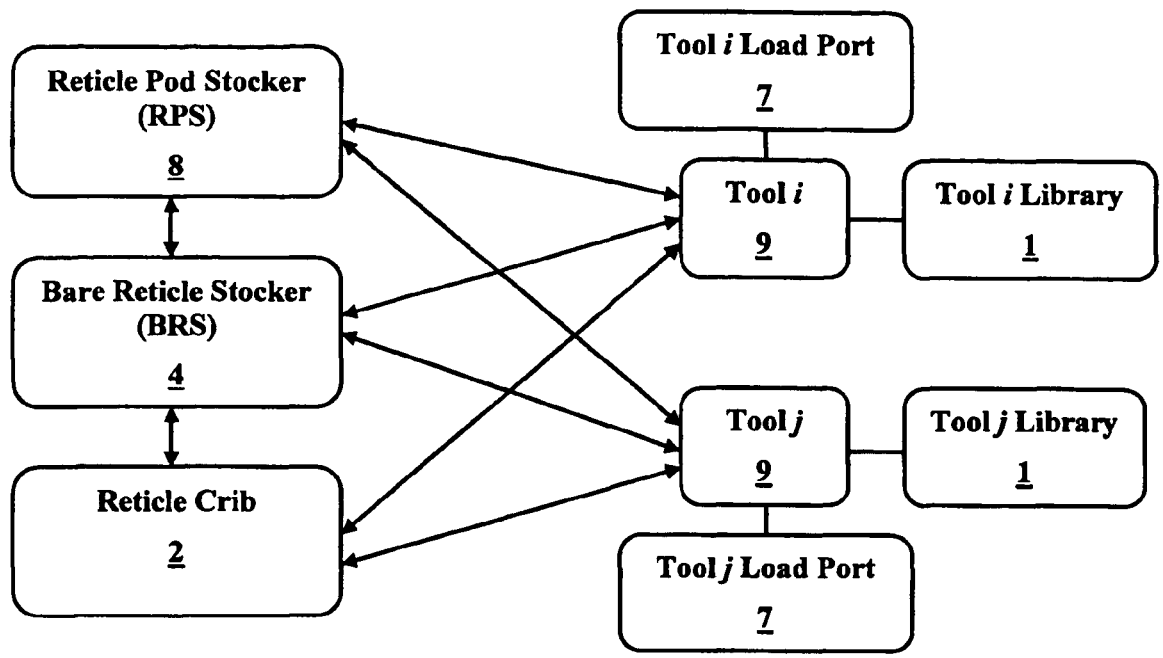
FIG. 1 is a schematic diagram of a photolithography bay according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for improving and controlling the semiconductor manufacturing process. The embodiments of invention address this need by providing a method and system for the intelligent, automated management of auxiliary equipment, such as reticles, associated with a processing tool. Moreover, the embodiments of the invention model future events such as work-in-process/ wafers-in-process (WIP) projections related to a tool (i.e., a photolithographic system), which are used in a production process such as semiconductor manufacturing. In the context of 300 mm semiconductor manufacturing, WIP exists in work lots as a set of wafers stored in a Front Opening Unified Pod (FOUP). Furthermore, the modeling is accomplished based on the processing and projection of the movement of WIP which is occurring prior to the WIP reaching the tool. Referring now to the drawings, and more particularly to FIGS. 1 through 14, there are shown preferred embodiments of the invention.

As an example, photolithography tools are described. However, those skilled in the art would readily understand how other tools and processes could be used within the framework provided by the embodiments of the invention. A schematic diagram of a photolithography bay is illustrated in FIG. 1. As shown, the photolithography bay comprises an interaction between a reticle crib 2, a bare reticle stocker (BRS) 4, a reticle pod stocker (RPS) 8, and any of a number of tools 9. The reticle crib 2 is an area in the manufacturing facility (i.e., "fab") in which reticles are temporarily stored for the purpose of inspection for defects. Once reticles have been inspected they are either sent for processing repairs of observed defects, or else returned to a tool 9, BRS 4, or RPS 8. A BRS 4 is a storage tool for reticles not currently designated for use in a particular photolithography tool. Similarly, an RPS 8 is a reticle storage tool, in which reticles are stored within protective pods (containers), in contrast to the BRS 4 in which they are stored bare (without pods). Storage space is limited in each tool's library 1, at the RPS 8, at the BRS 4, and possibly at the reticle crib 2 as well. Reticles are resident in a tool's library 1 in order for the tool 9 to be able to conduct a photolithographic step relying upon said reticles as auxiliary material. BRS are used due to the lack of clean room floor space. The kitting and management of BRS represent an additional level of complication for reticle management driven by semiconductor manufacturing practices.

Figure 2:
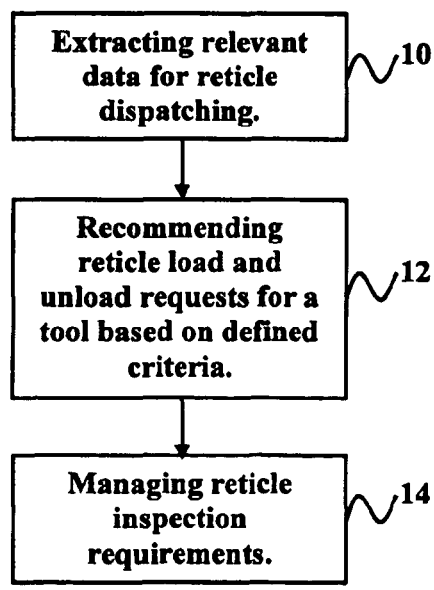
FIG. 2 is a first flow diagram illustrating a method according to an embodiment of the invention.

A flowchart illustrating a reticle dispatching method according to an embodiment of the invention is provided in FIG. 2. The invention's reticle dispatching method is used for an automated response to reticle allocation needs at photolithography tools. First, the method provides extracting (10) relevant data for reticle dispatching. Second, the invention recommends (12) reticle dispatch actions in the form of load and unload requests for a tool based on criteria including the tool library capacity, reticle dispatch priority, tool critical capacity buffer level, reticle inspection limits, projected inspection limits, WIP projection of future wafer lots, and user-defined number (N) of move requests based on Automated Reticle Handling System (ARHS) capacity. Third, the invention manages (14) reticle inspection requirements.

The tool library capacity represents a physical storage space limit on the finite number of reticles that can be stored in a tool's library 1. Typical tool libraries store up to ten reticles. The reticle dispatch priority is a measure of the importance of having a reticle available at a tool for processing a wafer lot. Furthermore, the tool critical capacity buffer level is a value that defines the level (number of reticles) at which a tool's library 1 is considered to be nearly full (e.g. eight out of ten library spaces full), and at which point it is necessary to remove unneeded reticles from the tool's library 1. Moreover, the reticle inspection limits are measured by the number of wafer exposures. There are two types of limits: the warning limit and the inhibit limit. The warning limit represents the number of exposures that defines a point of reference, which indicates that the reticle is near the point of requiring inspection. The inhibit limit is the maximum number of allowed exposures before the reticle must be inspected.

The WIP projection of future wafer lots is a report that defines an estimate of the schedule of arrival of wafer lots at the lithography bay for processing. It is defined by the following fields: reticle part number, number of wafer lots associated with the reticle part number, projected arrival/completion time window for set of wafer lots, priority of the most important wafer lot, and the sequence number representing the look ahead priority (determined by sorting the reticles by the first arrival time of a wafer lot, priority, and number of associated wafer lots).

A user-defined number (N) of move requests based on ARHS capacity is the number of reticle movement requests that should be reported at a time, based on the frequency at which the list of requests is generated, and the estimated number of move requests that can be executed (based on ARHS capacity) before the generation of the next list.

Generally, an embodiment of the invention provides a method of controlling a manufacturing system, wherein the method comprises providing a plurality of workpieces to be processed on a processing tool, wherein the plurality of workpieces are located at processing stations prior to the processing tool. The method then determines auxiliary equipment allocation needs for the processing tool based on characteristics associated with the plurality of workpieces prior to the workpieces arriving at the processing tool. Next, the method sends auxiliary equipment to the processing tool based on the allocation needs prior to the workpieces arriving at the processing tool.

Figure 3:
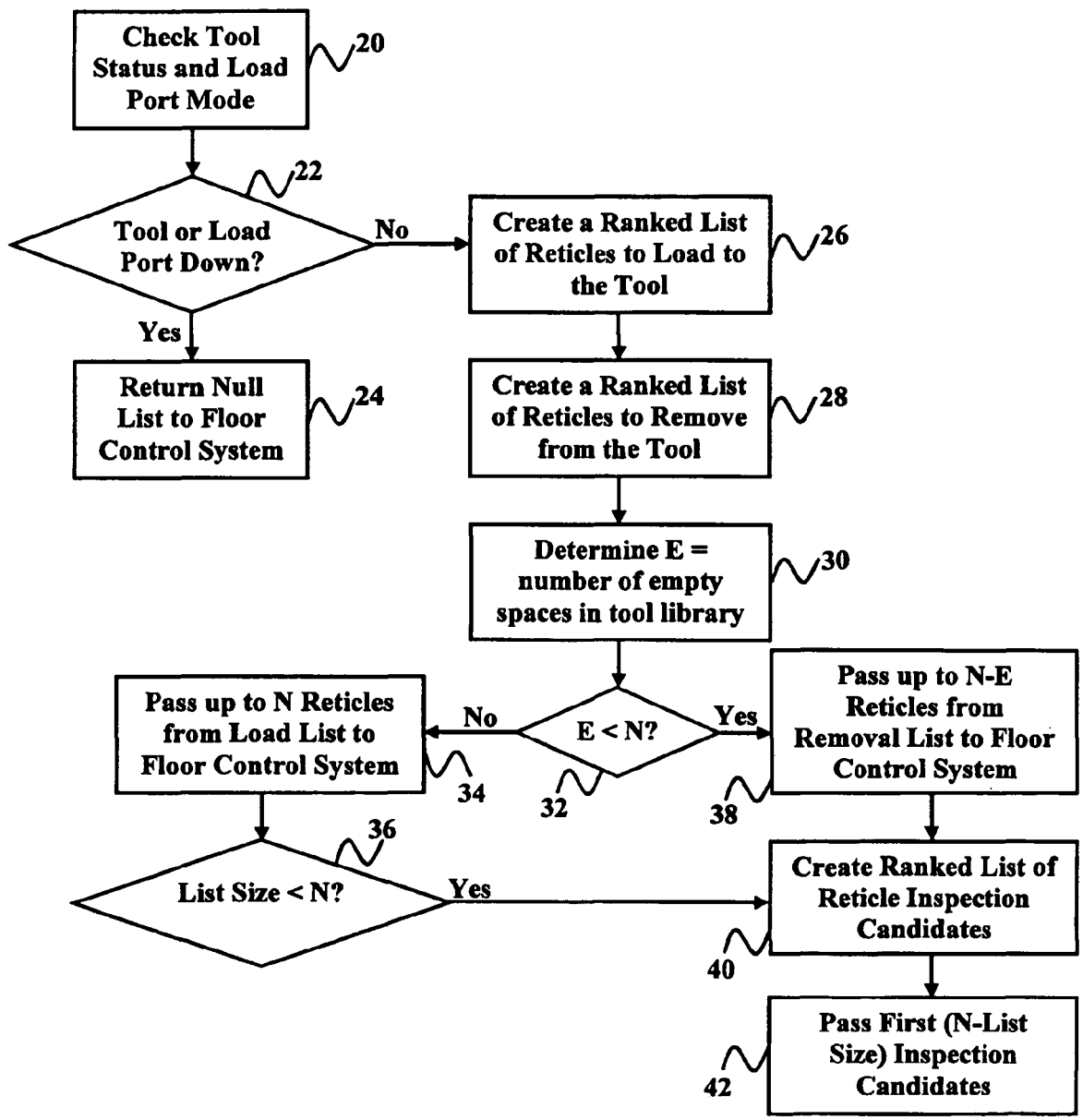
FIG. 3 is a second flow diagram illustrating a method according to an embodiment of the invention.

The methodology provided by an embodiment of the invention specifically includes a series of steps for reticle dispatching. These steps are generally shown in FIG. 3, where the first step is to check (20) the tool status and load port mode. Here, it is determined (22) whether the tool 9 or load port 7 (shown in FIG. 1) is functioning. If the tool 9 is down (not in operation) or both load ports 7 are in manual mode, then an empty (null) list is sent back (24) to a floor control system (FCS) 145 (shown in FIGS. 10 and 11).

The load port 7 is the part of the tool 9 at which unprocessed wafer lots are received, and processed wafer lots are retrieved by the AMHS via automated guided vehicles. For ease of understanding only one load port 7 is illustrated for each tool 9 in FIG. 1. However, multiple load ports 7 may be associated with each tool 9.

In the second step, if the tool 9 is running and has at least one load port 7 in auto mode (i.e. automatically dispatched), then a reticle dispatch list (RDL) is generated. The reticle dispatch list, also referred to as a Reticle Action List (RAL), is a set of commands of recommended reticle movements that includes a reticle identifier, its current location, the location it should be moved to, and the associated priority of the move. This step includes reading in the wafer lot dispatching list (a list of product wafer lots with associated dispatch priority), creating a list of reticles currently in tools 9, determining the number of empty spaces in tool libraries 1, and generating the corresponding reticle dispatching. For each reticle, the highest ranking of associated wafer lots is set as the reticle's rank.

A prioritized list of reticles to load to the tool 9 is created (26) based on the list of reticles that are not currently in the tools 9, for example, reticles that are stored in the BRS 4 or RPS 8. This is referred to as a Reticle Load List (RLL). Next, a prioritized list of reticles to be removed from the tool 9 is created (28). This is referred to as a Reticle Remove List (RRL). These are reticles which are not in the RAL. If the reticles are in the tool 9 but are not in the reticle dispatching list, then these reticles are candidates to be retrieved/removed (28) from the tool 9 if the number of reticles in the tool 9 exceeds the tool critical capacity buffer level.

Moreover, if the reticles are in both the RLL and in the tool 9, then they are recommended to stay in the tool 9. If there are wafer lots that are forecasted to arrive in the photolithography bay within a user-defined time window, according to the forecasted WIP projection report containing the projected WIP projection of future wafer lots (also called a "Look Ahead" report), their associated reticles are also recommended to stay in the tool 9.

For the reticles in the RLL; i.e., available to be sent from storage in a BRS 4 or RPS 8 to a tool 9, the ranking is set by the wafer lot dispatching list. For reticles in the RRL; i.e., eligible to be sent from a tool 9 to be stored in a BRS 4 or RPS 8, the ranking is set according to the WIP projection report priority (based on the number of wafer lots, wafer volume, estimated time window for wafer lots, and priority of wafer lots).

Here, the global priority ranks are set (32) among all actions in the RLL and RRL. At this decision step (32), the number (internal buffer) of empty spaces, E, in the tool library 1 is compared with the user-defined number, N. The tool library 1 is the internal storage space for storing reticles at the tool 9 which are not currently in use. If the tool library 1 is full, then the remove action (actions on the RRL) is set (38) as a preemptive priority rank. Whereas, if the tool library 1 is not full, then the load action (actions on the RLL) is set (34) as the preemptive priority rank.

In the third step (36), if the size of the reticle list on the RLL are less than the allowed number of recommendations, then a reticle inspection list is created (40) based on warning/inhibit levels, number of reticle IDs for a reticle part number (i.e. the number of duplicate reticles), and balancing of reticle inspects. If reticles are available for inspection, then the highest priority reticles are established as a relevant reticle crib 2 for inspection, where the reticle crib 2 is the area of the fab in which reticle inspections are performed. Otherwise, the reticle is sent to the relevant RPS 8, where the reticle is stored inside of its protective pod until either it is dispatched again to a tool 9, or sent to the BRS 4 for storage. In the fourth step (42), the RDL list is created with a user-defined number of (at most N) recommended reticle move actions to pass to the FCS 145 (shown in FIGS. 10 and 11). The FCS 145 is responsible for executing the reticle dispatch recommendations.

In other words, the embodiments of the invention create two lists of reticles: (1) those which are candidates to be loaded, the RLL; and (2) those which are candidates to be removed, the RRL, based on reticle location, wafer lot dispatch list, and forecasted WIP projection of upstream wafer lot arrivals, and then the embodiments of the invention create a prioritized list of recommended reticle movements based on tool library capacity, dispatch priority, forecasted wafer lot priority, and reticle handling system bandwidth.

Figure 4:
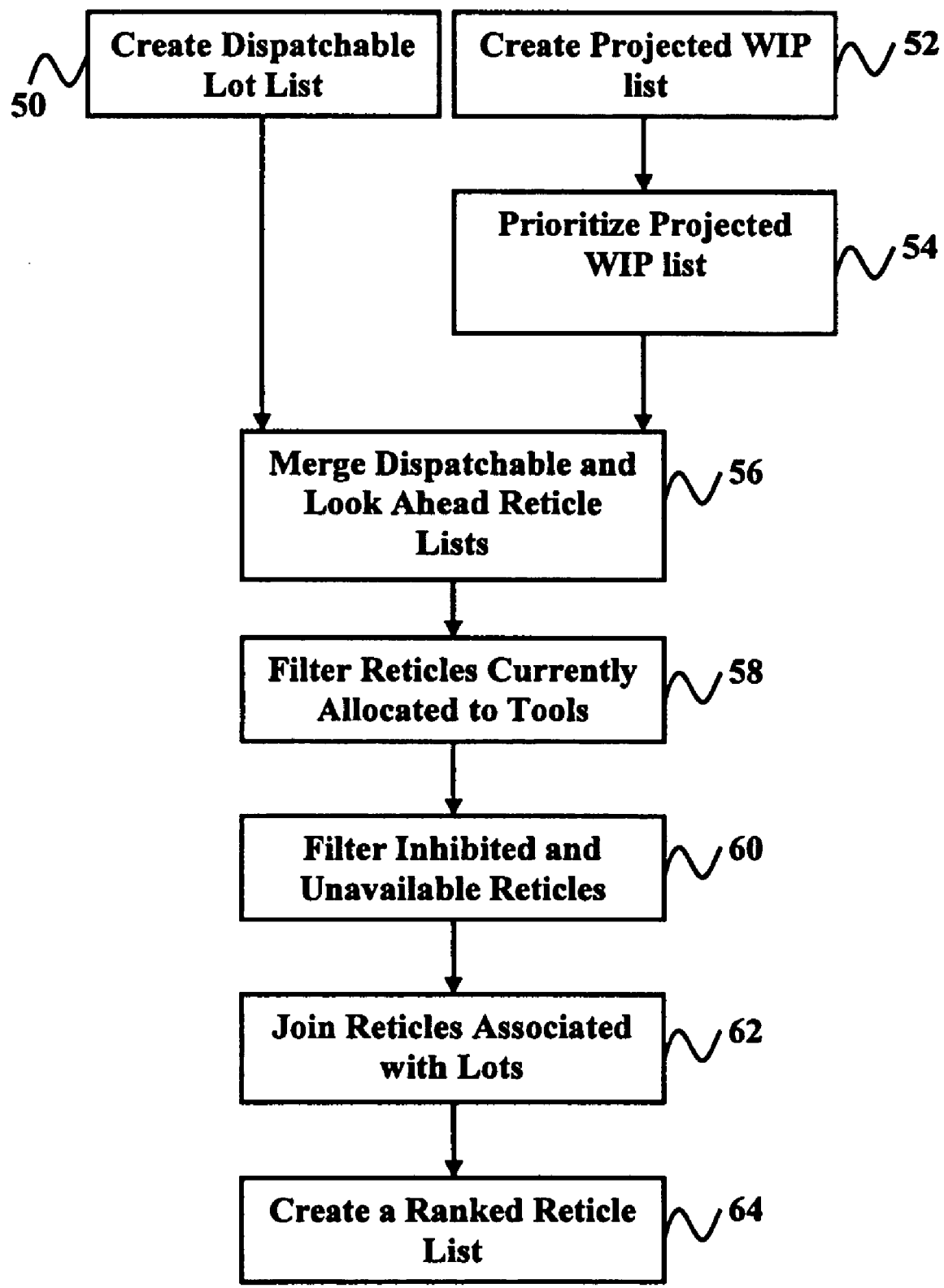
FIG. 4 is a third flow diagram illustrating a method according to an embodiment of the invention.

As illustrated in FIG. 4, the method of creating a RLL according to an embodiment of the invention is provided. First, a dispatchable wafer lot list is created (50). Additionally, a WIP projection report is created (52) and then prioritized (54). Thereafter, the dispatchable and WIP projection reports are merged (56) into a single list. Next, reticles that are currently allocated to tools 9 are removed (58) from the list, and then inhibited and unavailable reticles are removed from the list 60. Further, reticles which are already in the process of being loaded or unloaded, based on recent dispatch decisions, must be removed from the list. These relevant reticle movements are tracked using a Reticle Execution List (REL) which lists all moves that are in progress but have not yet been completed. After this, reticles associated with wafer lots in either the dispatchable wafer lot list or the WIP projection report have their corresponding wafer lot information joined (62) to the merged list. Finally, the RRL is created (64) based on the priority of the wafer lots associated with the reticles.

Figure 5:
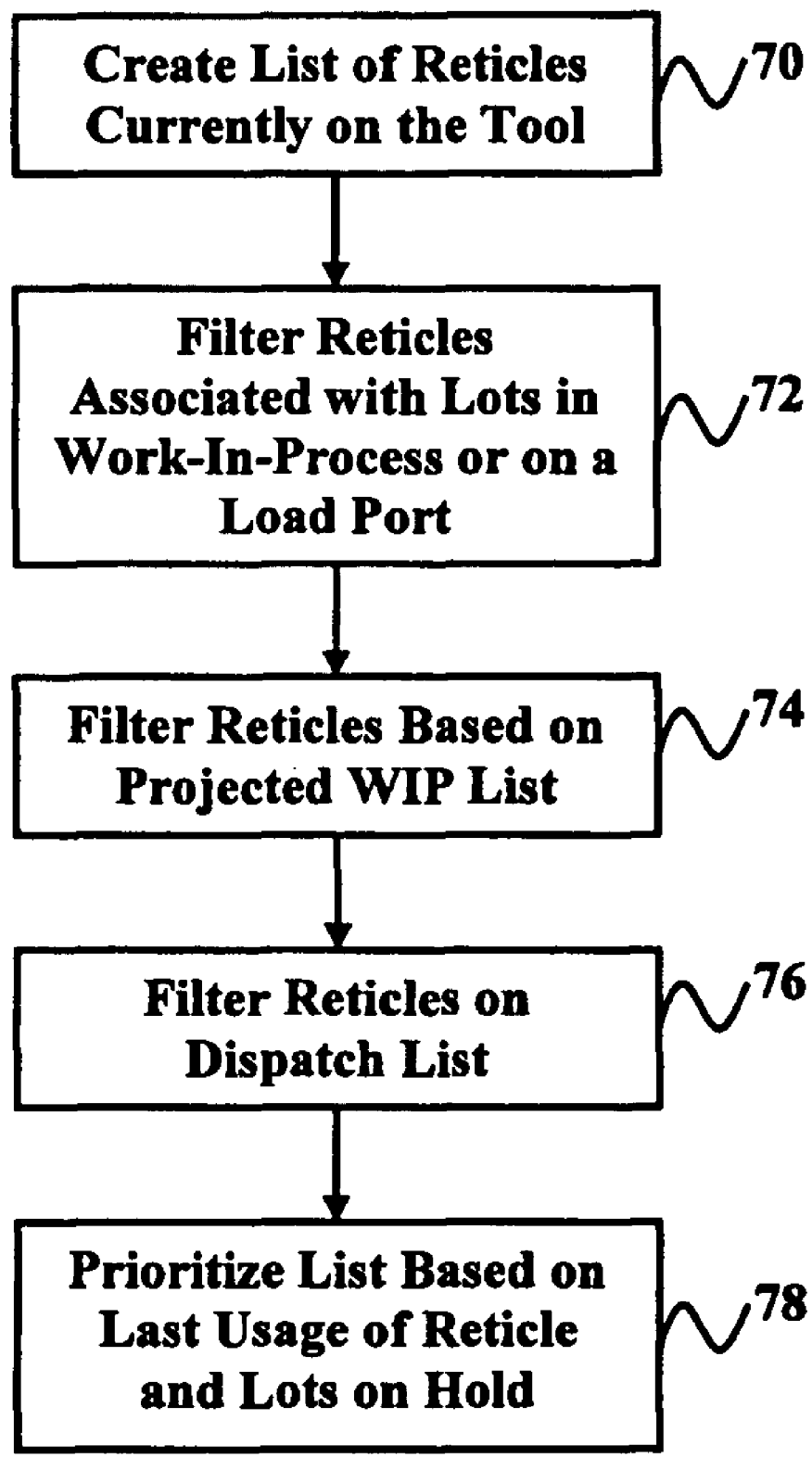
FIG. 5 is a fourth flow diagram illustrating a method according to an embodiment of the invention.

As illustrated in FIG. 5, the method of RRL creation according to an embodiment of the invention is provided. First, a list of reticles that are currently on the tool 9 is created (70). Second, reticles associated with wafer lots in the WIP projection report or on a load port 7 are removed from the list (72). Then, reticles that are on the WIP projection report are removed from the list (74). Thereafter, the reticles on the dispatch list are removed from the RRL (76). Finally, the RRL is prioritized (78) based on the last usage of the reticle, and on the wafer lots on hold.

A further embodiment of the invention provides a method for pod pre-kitting. To move a reticle from a storage area (e.g. BRS 4, RPS 8), a reticle is enclosed in a protective pod. This involves placing reticles in pods and storing them in the RPS 8 based on forecasted need to load them to a tool 9 in the future. This process, called pre-kitting, is desirable because it reduces the response time for movement of reticles to the tools 9, and is based on the WIP projection of wafer lots and dispatchable WIP of wafer lots associated with each reticle (e.g., production volume, arrival window, and priority). The process kits (stores a reticle in a pod) and unkits (removes a reticle from a pod) reticles based on wafer lot priorities, pod stocker capacity and dispatch priority. Moreover, the process manages reticle inspection requirements.

Generally, the invention's pod pre-kitting process comprises checking the RPS status. Specifically, it is determined whether the RPS 8 is operational. If the RPS 8 is down (not operational) then the embodiments of the invention send a null (empty) reticle dispatch list to the FCS 145 (shown in FIGS. 10 and 11). If the RPS 8 is running, then the following relevant data is collected. First, wafer lots available for dispatching are read into memory on an associated computer system, such as the system illustrated in FIG. 14. The corresponding wafer lot dispatching priority is computed based on wafer lot dispatching prioritization rules. Second, an associated reticle is determined for each wafer lot in the list developed in the first step. For each reticle, the reticle rank is set to the highest rank of associated wafer lots. Third, the WIP projection report is read into memory with: the reticle part number, number of wafer lots, projected arrival/completion time window for set of wafer lots, priority class of the most important wafer lot, and sequence numbers representing the priority (determined by sorting the reticles by first arrival time of a wafer lot, priority class, and number of associated wafer lots).

Fourth, the lists from the first and second steps are linked by the reticle part number (an indicator that codes the reticle type) such that the list contains a unique list of reticles and their associated based on the highest ranked wafer lot dispatch and "look ahead" priority wafer lot dispatch priority and look ahead priority. If there are multiple reticles of the same type; i.e, same reticle part number, then a specific reticle is chosen. This list is referred to as the pod stocker Reticle Dispatch List (RDL). From the pod stocker RDL, reticles that are "Not Available", reticles that are "Inhibited", or reticles that are otherwise unavailable for dispatching, are removed from the list. To avoid conflicts with the photolithography tool RDL (creation of a reticle dispatch list may be initiated by events originating at photolithography tools 9, BRSs 4, or RPSs 8, and thus there is the need to avoid conflicts), reticles associated with the M highest priority wafer lots on each tool 9 are filtered out, where M is a user-defined number based on the reticle handling system throughput. Next, an RPS ID and a BRS ID are associated with each reticle in the list. Thereafter, the number of empty reticle pods in the RPS is computed. Finally, the N highest priority reticle moves is computed, where N is a user-defined number of reticle action recommendations. The following is a pseudo-code description of the method for creating a pod stocker RDL.

Pod Stocker RDL:

```
Drbl_id - reticle id
Eqp_id - current equipment id
PS_id - pod stocker id
BRS_id - bare reticle stocker id
Lot_priority - priority of associated wafer lot (if there is no associated
wafer lot or the lot is in top 10 dispatchable wafer lots,
then set priority to NULL)
Look_ahead_Priority - priority of reticle based on look ahead arrival of
wafer lots. If reticle is not in look ahead list, then set priority to NULL
Count - Number of empty pods on pod stocker
Rules for associating a priority with the reticle move request:
Definitions:
N = number of move requests to the floor control system
CL = Pod stocker (capacity − buffer)
```

Figure 6:
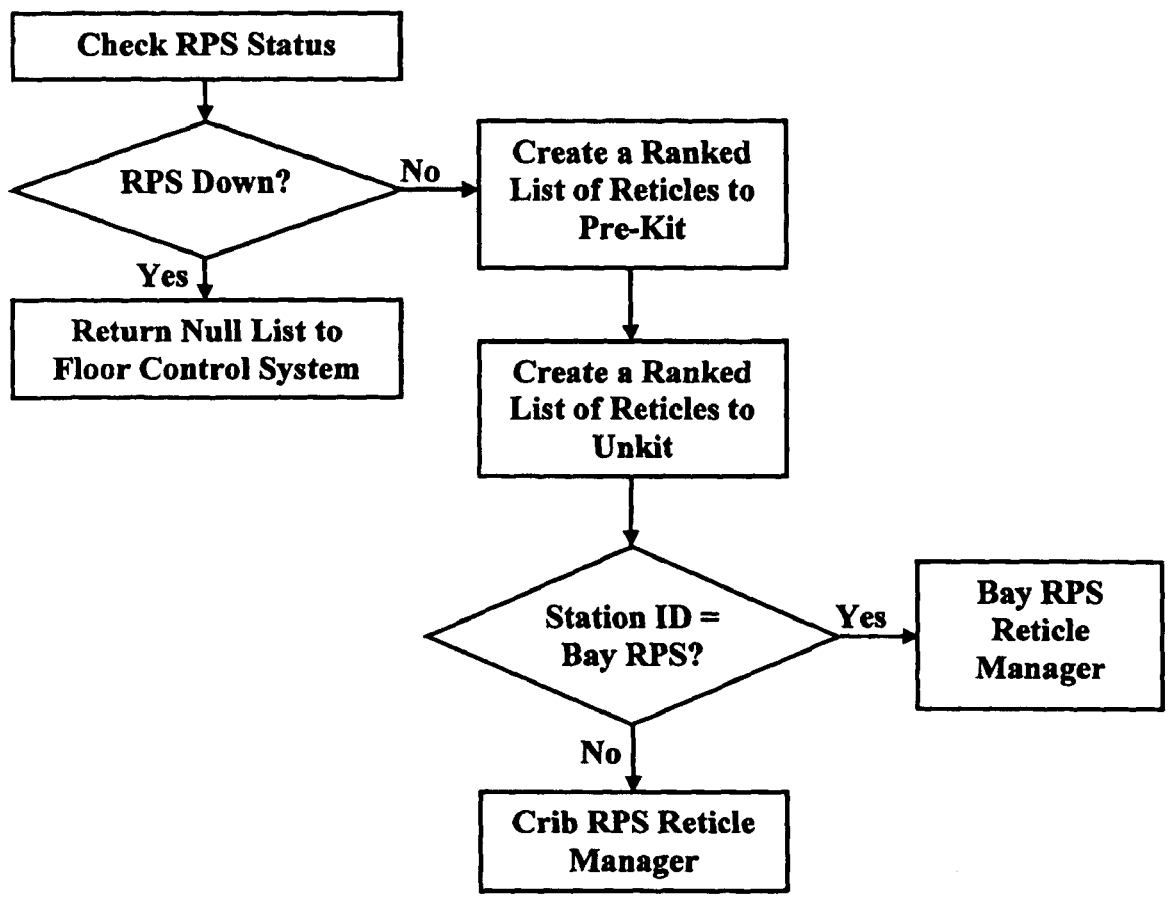
FIG. 6 is a fifth flow diagram illustrating a method according to an embodiment of the invention.
Figure 7:
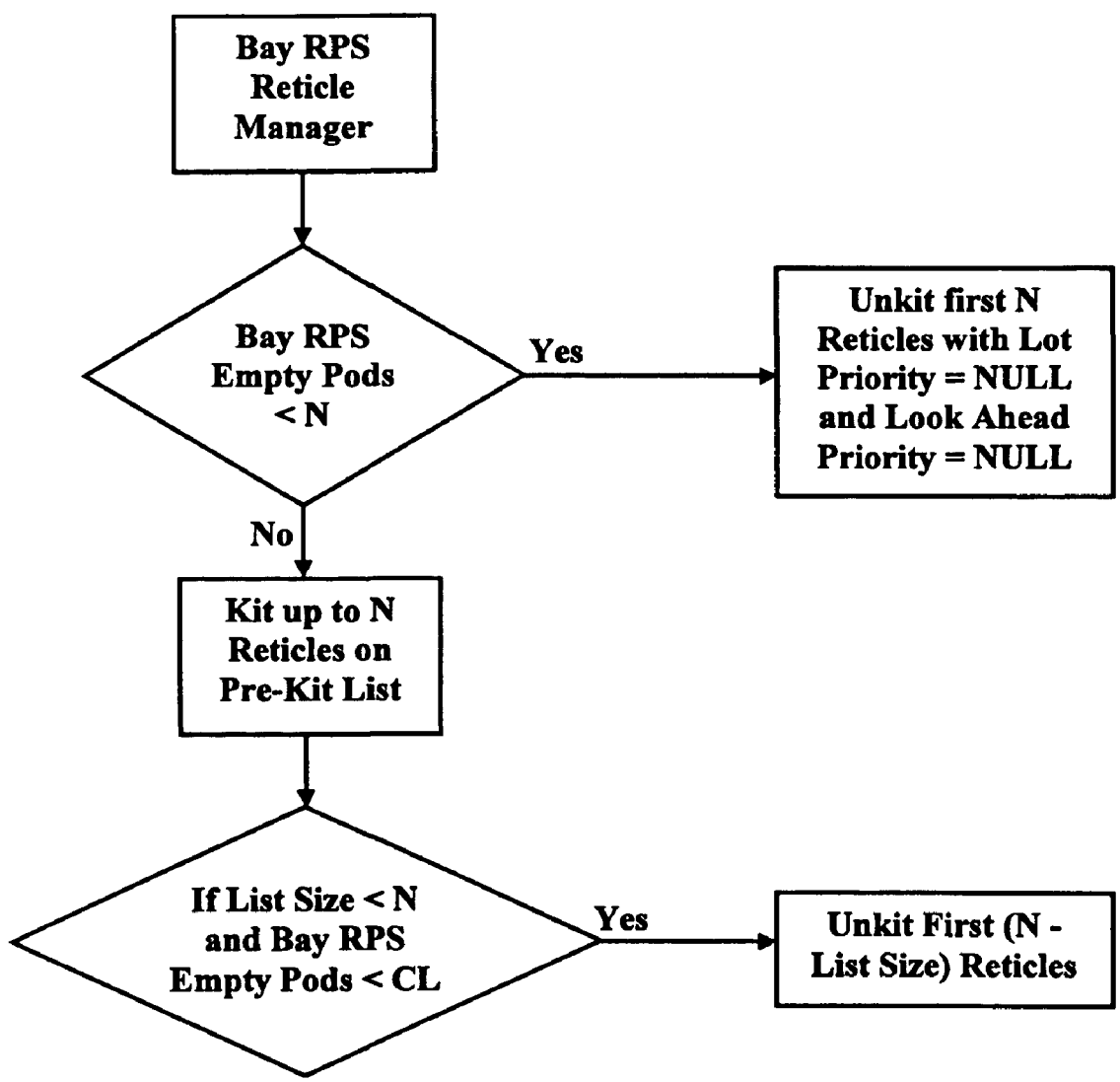
FIG. 7 is a sixth flow diagram illustrating a method according to an embodiment of the invention.
Figure 8:
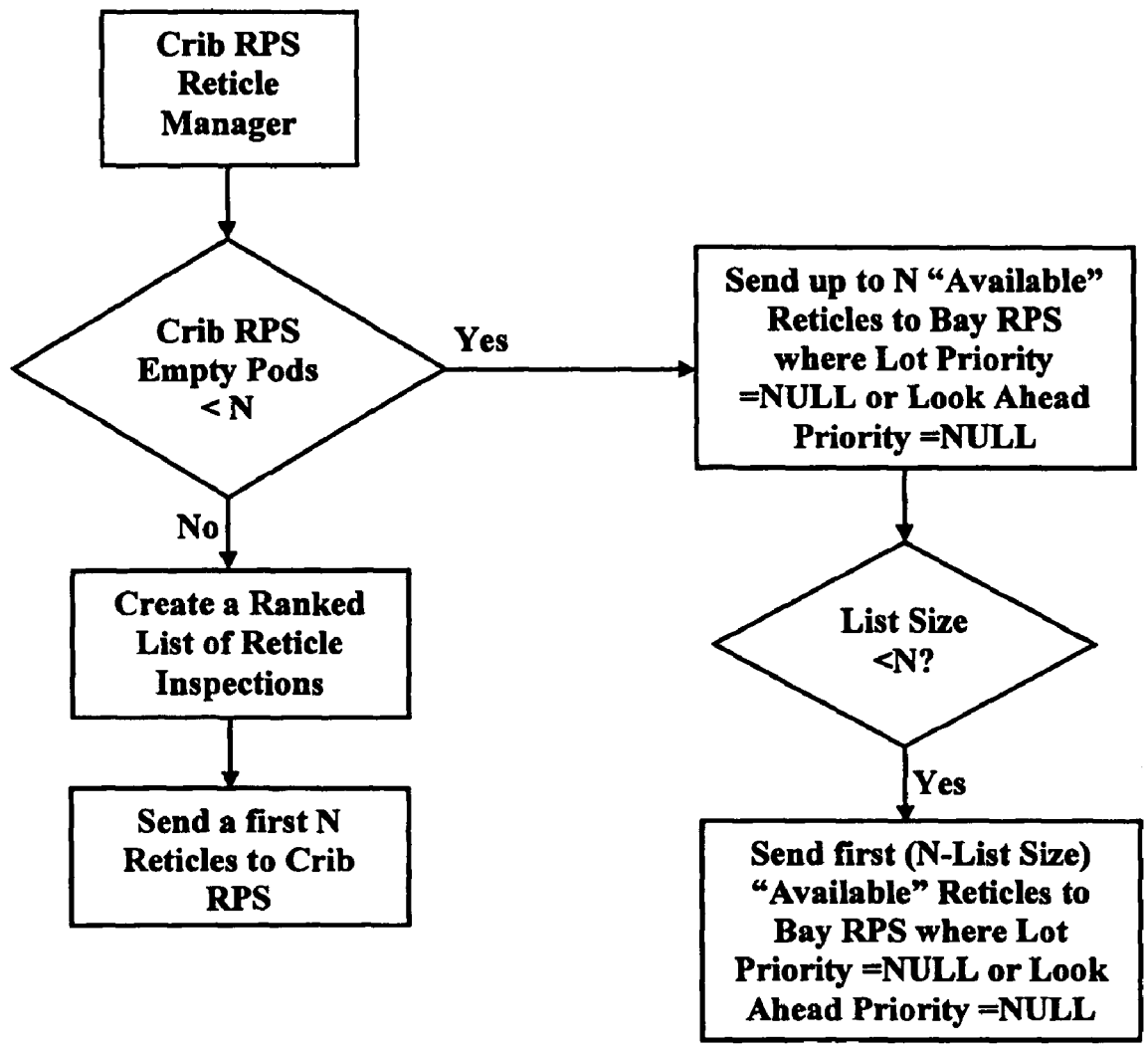
FIG. 8 is a seventh flow diagram illustrating a method according to an embodiment of the invention.
Figure 9:
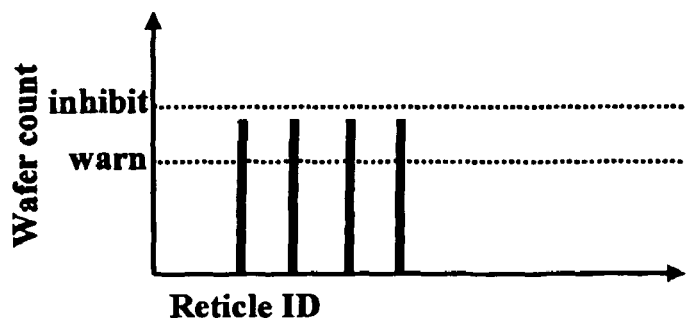
FIG. 9 is a graphical illustration of a reticle inspection embodiment of the invention.

An embodiment of the invention also provides a pod kitting pseudo-code, which is graphically illustrated in FIGS. 6 through 8, and which may be used to implement the above-described methods. Generally, the code includes:

```
N = N - number of actions in queue + executing according to RAL and REL
Sort list by (Lot_priority, Look_ahead_priority);
If(Station_id = = Bay PS){
If(Bay PS Empty Pods < N) Unkit any N reticles with Lot_priority = = NULL AND
Look_ahead_priority= =NULL;
Else{
Kit first M reticles where M = min(N, number of reticles with Lot_priority!=NULL OR
Look_ahead-priority!=NULL);
If (M<N AND Bay PS Full Pods > CL) Unkit first N–M reticles with Lot_priority=
=NULL AND Look_ahead_priority= =NULL;
}
}
If(Station_Id = =Crib PS){
If(Crib PS Empty Pods <N){
Send first M reticles to Bay PS where M = min(N, number reticles with Lot_priority!
=NULL OR Look_ahead_priority !=NULL);
If(M<N) Send first N–M reticles to BAY BRS where
Lot_priority== NULL AND Look_ahead_priority==NULL;
}
}
```

In other words, the method provides, first, creating a list of candidate reticles to kit and unkit based on reticle requirements for dispatchable wafer lots, high volume wafer lot types, and forecasted upstream wafer lot arrivals. Second, the method creates a prioritized list of recommended kitting and unkitting actions based on wafer lot priority, forecasted upstream wafer lot priority, pod availability, and reticle handling system bandwidth. As such, the method prioritizes kitting, unkitting, and inspection actions.

An embodiment of the invention further includes a reticle inspection method, which creates a ranked list to inspect the reticles via a two stage methodology. Because reticles have defined warning and inhibit limits which specify inspection requirements, the inspection ranking list considers the number of each reticle part number available, the proximity of wafer count to warn/inhibit limits, and the importance of keeping reticles out of phase. An example of such a ranking is generally demonstrated in FIG. 9, which illustrates the actual number of exposures for different reticles relative to the "warning limit" and "inhibit limit".

More specifically, the reticle inspection method comprises, first, creating a list of all potential reticles for inspection and categorization into three types: reticles associated with the dispatchable wafer lot, reticles associated with WIP projection report wafer lots from upstream, and reticles that are not the above two types (other). Second, reticles are marked as "Over Inspect Limit" (OI) if the current wafer count is greater than or equal to the Inhibit Limit and "Over Warning Limit" (OW) if the current wafer count is greater than or equal to the Warning Limit. In the third step, reticles are initially prioritized into the following groups: Dispatchable and OI; Dispatchable and OW; WIP Projection within "time window" and OI; WIP Projection within "time window" and OW; Other and OI; Other and OW; and Other.

Fourth, the method sub-prioritizes reticles in each of the following groups: Type (a) reticles prioritize according to highest priority dispatchable wafer lot; Type (b) reticles are prioritized according to highest priority dispatchable wafer lot, then de-prioritize reticles with Inhibit Limit−Wafer Count>the number of Pending Wafers; Type (c) reticles are prioritized according to WIP projected arrival time of first wafer lot at the litho WIP Stocker; Type (d) reticles prioritize according to projected arrival time of first wafer lot at litho WIP Stocker, then de-prioritize reticles with Inhibit Limit−Wafer Count>the number of wafers in the time window, subject to timing and available capacity at the reticle crib; Type (e) reticles are prioritized according to projected arrival time of the first wafer lot at the lithography WIP Stocker.

In the fifth step, reticles that are covered by a duplicate reticle are de-prioritized. Here, reticles over an inhibit limit but covered by a duplicate reticle that are available under the warning limit are de-prioritized to type (e) reticles, and reticles that are over a warning limit but covered by a duplicate reticle that are under the warning limit are de-prioritized to type (e) reticles.

Figure 10:
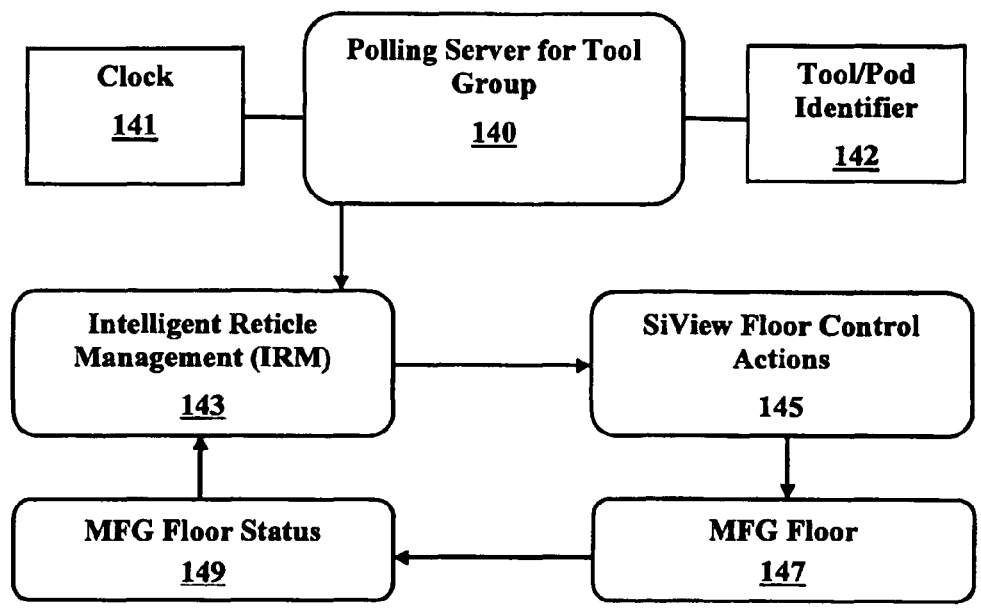
FIG. 10 is a first system diagram according to an embodiment of the invention.

A system for implementing the above-described methods is illustrated in FIG. 10. As shown, a polling server 140 for a tool group is connected to an Intelligent Reticle Management generator (IRM) 143. The polling server 140 is configured to a clock 141 for tracking when the IRM 143 should be polled. Also, the polling server 140 is configured to a tool/pod identifier 142 to track which tool or pod stocker is being polled. The IRM 143 generates a Reticle Dispatch Action List (RDA) for SiView (the floor control system) 145 to execute floor control actions, which is sent to the manufacturing floor 147. This affects the manufacturing floor status which feeds back in IRM 143 at the next iteration of the method. Moreover, the polling server 140 polls the IRM 143 to initiate the generation of the RDA for SiView 145.

Figure 11:
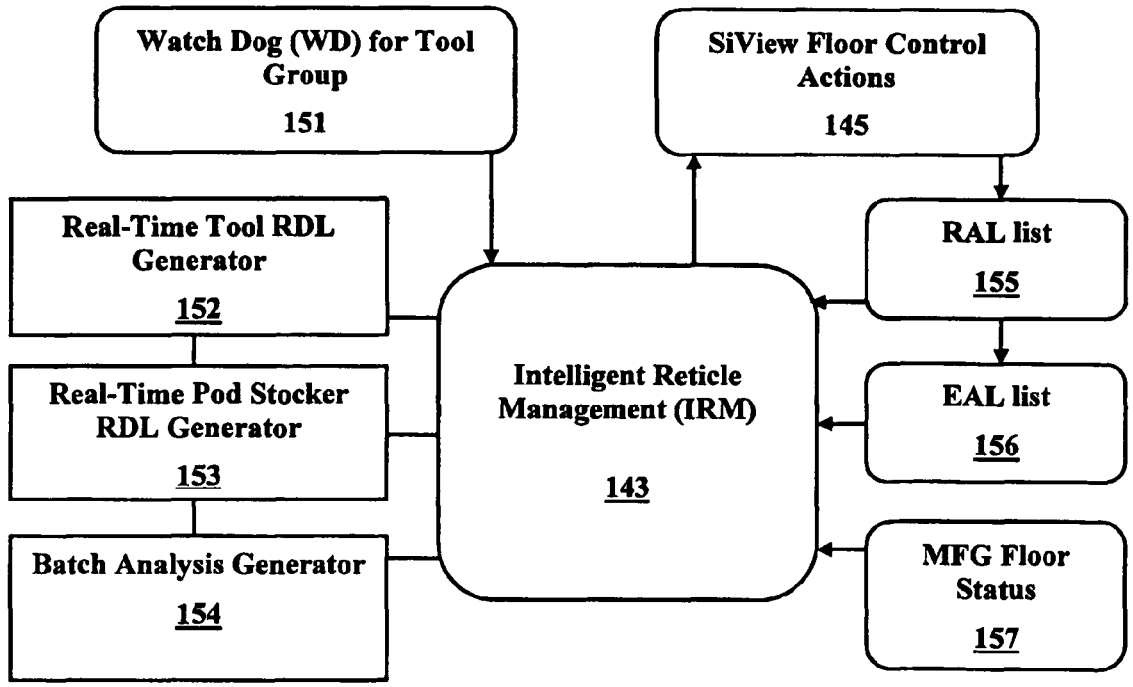
FIG. 11 is a second system diagram according to an embodiment of the invention.

As provided in FIG. 11, the IRM 143 is further coupled to a real-time tool RDA generator 152, a real-time pod stocker RDA generator 153, and a batch analysis generator 154. The batch analysis generator 154 provides the core data for the report, the development of the WIP projection, and other analysis. A watch dog (WD) for the tool group is an active software process that polls the IRM 143 for a RDL. The IRM 143 generates a RDL for SiView 145 to execute. SiView 145 includes floor control actions that are coupled to a RDL list 155, which communicates with an EAL list 156 and the IRM 143. The EAL list 156 communicates with the IRM 143 as well. Also, a manufacturing floor status controller 157 communicates with the IRM 143.

Figure 12:
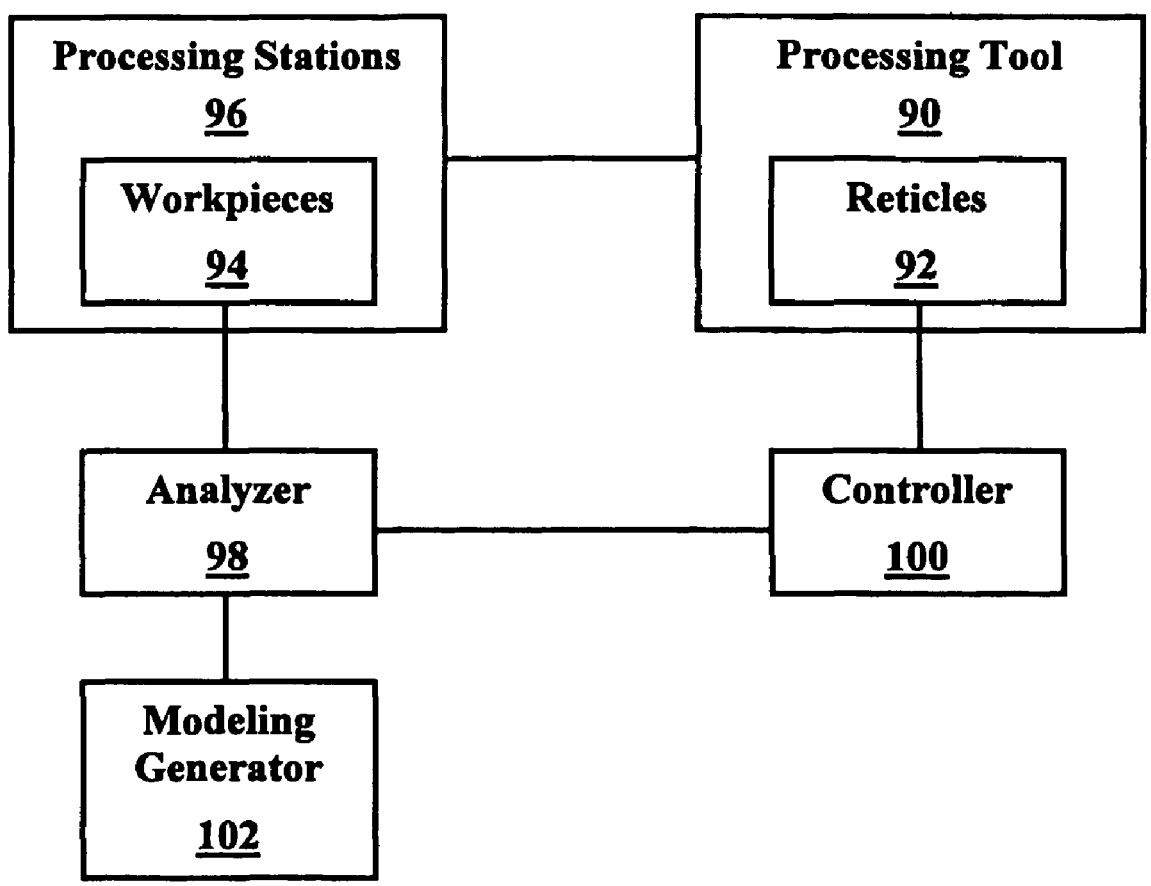
FIG. 12 is a flow diagram illustrating a preferred method according to an embodiment of the invention.

According to another aspect of the invention, a system for controlling a manufacturing process is provided and illustrated in FIG. 12, wherein the system comprises a processing tool 90 and auxiliary equipment 92, a plurality of workpieces 94 to be processed on the processing tool 90, wherein the plurality of workpieces 94 are located at processing stations 96 prior to the processing tool 90, an analyzer 98 configured for determining, from characteristics associated with the plurality of workpieces 94, an order of arrival of a first of the workpieces 94 to arrive at the processing tool 90, and a controller 100 configured to the analyzer 98 and operable for providing auxiliary equipment 92 corresponding to the first workpieces 94 to the processing tool 90 prior to the arrival of the first workpieces 94 to the processing tool 90, wherein the analyzer 98 is configured for ranking the workpieces 94 in terms of expected arrival times to the processing tool 90. Additionally, the system further comprises a modeling generator 102 configured for modeling future events related to the processing tool 90 based on work-in-process projections generated from the analyzer 98. According to an embodiment of the invention, the processing tool 90 comprises a photolithographic system, the auxiliary equipment 92 comprises a reticle, and the plurality of workpieces 94 comprises semiconductor substrates.

Figure 13:
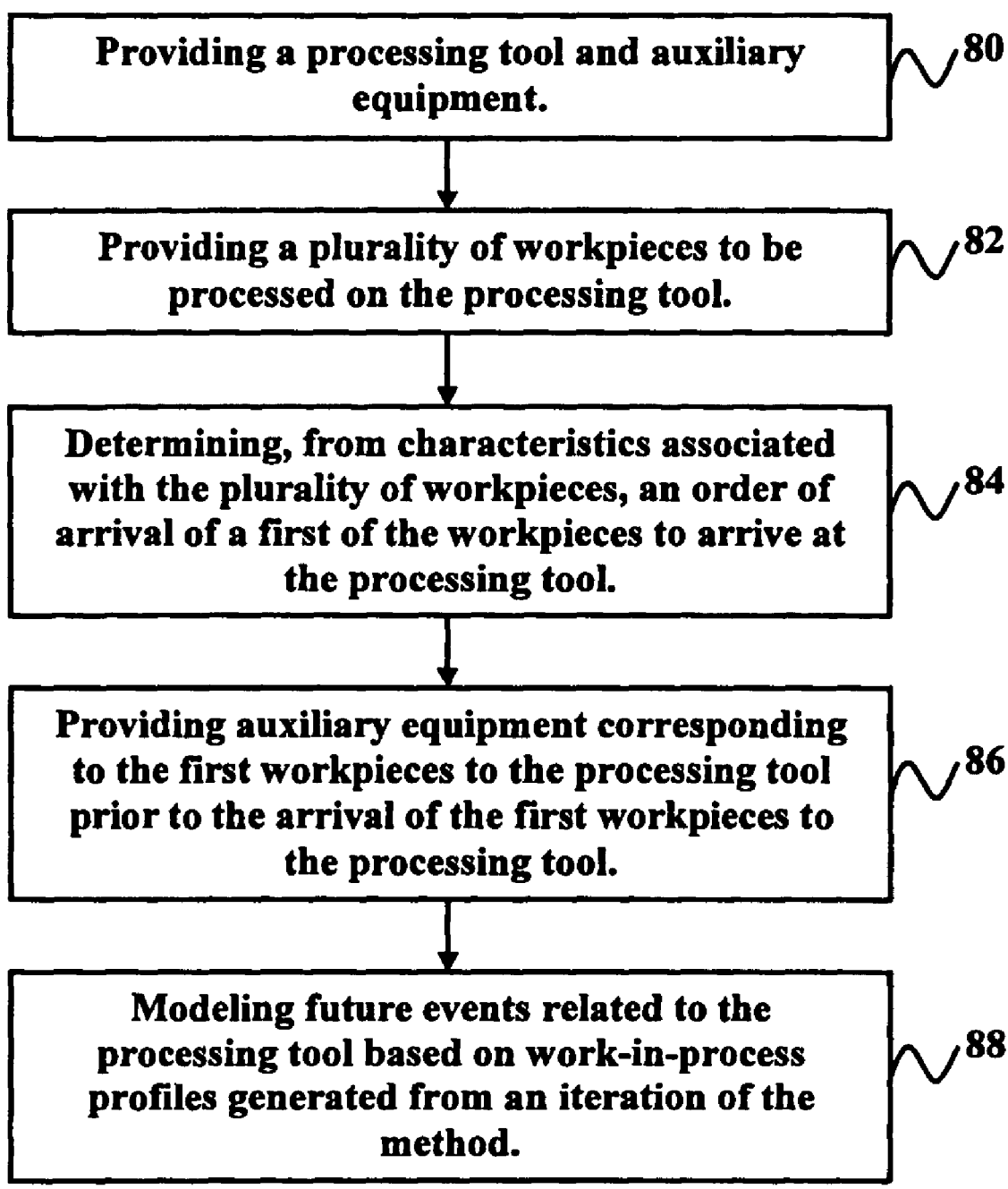
FIG. 13 is a third system diagram according to an embodiment of the invention.

A preferred method of controlling a manufacturing system according to an embodiment of the invention is illustrated in the flow diagram of FIG. 13, wherein the method comprises providing (80) a processing tool 90 comprising auxiliary equipment 92 (could include a plurality of auxiliary equipment). The next step involves providing (82) a plurality of workpieces 94 to be processed on the processing tool 90, wherein the plurality of workpieces 94 are located at processing steps prior to the processing tool 90. Then, the next step includes determining (84), from characteristics associated with the plurality of workpieces 94, an order of arrival of a first of the workpieces 94 to arrive at the processing tool 90. The final step involves providing (86) auxiliary equipment 92 corresponding to the first workpieces 94 to the processing tool 90 prior to the arrival of the first workpieces 94 to the processing tool 90. Additionally, the characteristics associated with the plurality of workpieces 94 comprises work lot priorities, processing times, auxiliary equipment handling system bandwidth, forecasted lot priorities, and pod availability. Furthermore, the step of determining (84) comprises ranking the workpieces 94 in terms of expected arrival times to the processing tool 90. Moreover, the method further comprises modeling (88) future events related to the processing tool 90 based on work-in-process projections generated from an iteration of the method.

Figure 14:
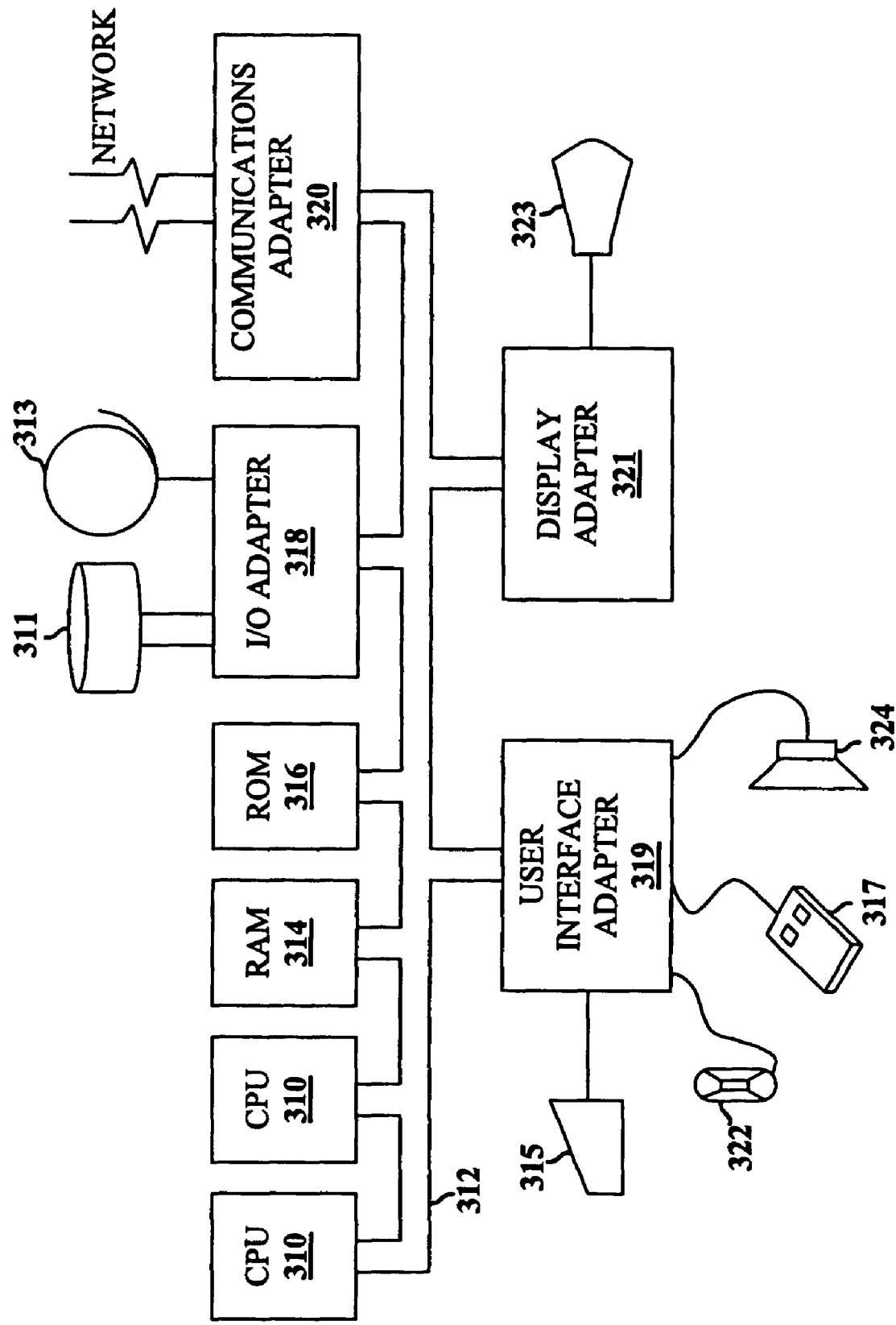
FIG. 14 is a computer system diagram according to an embodiment of the invention.

A representative hardware environment for practicing the embodiments of the invention is depicted in FIG. 14, which illustrates a typical hardware configuration of an information handling/computer system in accordance with the embodiments of the invention, having at least one processor or central processing unit (CPU) 310. The CPUs 310 are interconnected via system bus 312 to random access memory (RAM) 314, read-only memory (ROM) 316, an input/output (I/O) adapter 318 for connecting peripheral devices, such as disk units 311 and tape drives 313, to bus 312, user interface adapter 319 for connecting keyboard 315, mouse 317, speaker 324, microphone 322, and/or other user interface devices such as a touch screen device (not shown) to bus 312, communication adapter 320 for connecting the information handling system to a data processing network, and display adapter 321 for connecting bus 312 to display device 323. A program storage device readable by the disk or tape units is used to load the instructions, which operate the embodiments of the invention, which is loaded onto the computer system.

Generally, the embodiments of the invention provide a method and system for the intelligent, automated management of auxiliary equipment associated with a tool 9. The embodiments of the invention model future events such as work-in-process/wafers-in-process (WIP) projections related to a tool 9 (i.e., a photolithographic system), which is used in a production process such as semiconductor manufacturing. The modeling is accomplished based on the processing which is occurring prior to the WIP reaching the tool 9. Furthermore, auxiliary equipment associated with the tool 9(i.e., a reticle for a photolithographic system) is moved based on the modeled future events which are anticipated to occur at the tool 9. The embodiments of the invention use a computer program embedded in a computer system for carrying out the methodology and modeling described above.

Furthermore, the method provides a means for managing inspections of auxiliary equipment and, in a preferred embodiment, controlling the inspections through an inhibit limit considered proactively by looking ahead at a forecasted/estimated workload. The embodiments of the invention are applicable to many environments where the management and dispatching of auxiliary equipment/tools is relevant to efficient manufacturing processing, and particularly when the storage space for the auxiliary equipment/tools is limited.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

The invention claimed is:

1. A method of controlling a manufacturing system, said method comprising:
   providing at least one processing tool and at least one set of auxiliary equipment;
   providing a first prioritized list of the auxiliary equipment to load on said at least one processing tool based on a list of said auxiliary equipment absent from said at least one processing tool;

providing a second prioritized list of said auxiliary equipment to remove from said at least one processing tool;
supplying a plurality of workpieces to be processed on said at least one processing tool; and
determining, from characteristics associated with said at least one processing tool and said plurality of workpieces, an order of arrival of said auxiliary equipment to arrive at said at least one processing tool.

2. The method of claim 1, wherein in said providing, said at least one processing tool comprises a photolithographic system.

3. The method of claim 2, wherein in said providing, said auxiliary equipment comprises a reticle.

4. The method of claim 1, further comprising modeling future events related to said at least one processing tool based on work-in-process profiles generated from an iteration of said method.

5. The method of claim 1, wherein in said supplying, said plurality of workpieces comprise semiconductor wafers.

6. The method of claim 1, wherein said characteristics associated with said plurality of workpieces comprise work lot priorities, processing times, auxiliary equipment handling system bandwidth, lot priorities of forecasted lots, and pod availability.

7. The method of claim 1, wherein said determining comprises ranking said auxiliary equipment in terms of expected rival times to said at least one processing tool.

8. The method of claim 1, further comprising modeling future events related to said at least one processing tool based on work-in-process projections.

9. The method of claim 1, wherein the process of providing said first prioritized list comprises:
 creating a dispatchable workpiece lot list;
 creating a work-in-process (WIP) projection report;
 prioritizing said WIP projection report;
 merging said dispatchable workpiece lot list and said WIP projection report into a single list;
 removing said auxiliary equipment currently allocated to said at least one processing tool from said single list;
 removing inhibited and unavailable auxiliary equipment from said single list; and
 joining corresponding workpiece lot information of auxiliary equipment associated with workpiece lots in either said dispatchable wafer lot list or said WIP projection report to said single list.

10. The method of claim 1, wherein the process of providing said second prioritized list comprises:
 creating a removal list of auxiliary equipment that is currently on said at least one processing tool;
 removing, from said removal list, auxiliary equipment associated with workpiece lots in a work-in-process (WIP) projection report;
 removing, from said removal list, said auxiliary equipment that are on said WIP projection report;
 removing, from said removal list, said auxiliary equipment that are on a dispatchable workpiece lot list; and
 prioritizing said removal list based on the last usage of said auxiliary equipment and on workpiece lots on bold.

11. A method of controlling a manufacturing system, said method comprising:
 providing a plurality of workpieces to be processed on a processing tool, said plurality of workpieces located at processing stations prior to said processing tool;
 providing a first prioritized list of auxiliary equipment to load on said processing tool based on a list of said auxiliary equipment absent from said processing tool;
 providing a second prioritized list of said auxiliary equipment to remove from said processing tool;
 determining auxiliary equipment allocation needs for said processing tool based on characteristics associated with said plurality of workpieces prior to said workpieces arriving at said processing tool; and
 sending auxiliary equipment to said processing tool based on said allocation needs prior to said workpieces arriving at said processing tool.

12. The method of claim 11, wherein in said providing, said processing tool comprises a photolithographic system.

13. The method of claim 12, wherein in said determining, said auxiliary equipment comprises a reticle.

14. The method of claim 11, wherein in said providing, said plurality of workpieces comprise semiconductor wafers.

15. The method of claim 11, wherein said characteristics associated with said plurality of workpieces comprise work lot priorities, processing times, auxiliary equipment handling system bandwidth, lot priorities of forecasted lots, and pod availability.

16. The method of claim 11, wherein said determining comprises ranking said workpieces in terms of expected arrival times to said processing tool.

17. The method of claim 11, further comprising modeling future events related to said processing tool based on work-in-process projections.

18. The method of claim 11, wherein the process of providing said first prioritized list comprises:
 creating a dispatchable workpiece lot list;
 creating a work-in-process (WIP) projection report;
 prioritizing said WIP projection report;
 merging said dispatchable workpiece lot list and said WIP projection report into a single list;
 removing said auxiliary equipment currently allocated to said processing tool from said single list;
 removing inhibited and unavailable auxiliary equipment from said single list; and
 joining corresponding wafer lot information of auxiliary equipment associated with workpiece lots in either said dispatchable workpiece lot list or said WIP projection report to said single list.

19. The method of claim 11, wherein the process of providing said second prioritized list comprises:
 creating a removal list of auxiliary equipment that is currently on said processing tool;
 removing, from said removal list auxiliary equipment associated with workpiece lots in a work-in-process (WIP) projection report;
 removing, from said removal list said auxiliary equipment that are on said WIP projection report;
 removing, from said removal list, said auxiliary equipment that are on a dispatchable workpiece lot list; and
 prioritizing said removal list based on the last usage of said auxiliary equipment and on workpiece lots on hold.

20. A system for controlling a manufacturing process comprising:
 a processing tool configured for processing a plurality of workpieces;
 a processing station comprising said plurality of workpieces, wherein a location of said processing station precedes a location of said processing tool;
 an analyzer configured for determining, from characteristics associated with said plurality of workpieces, an order of arrival of a first of said workpieces to arrive at said processing tool; and a controller configured for providing auxiliary equipment corresponding to the first workpieces to said processing tool prior to the arrival of said first workpieces to said processing tool,
wherein said controller is adapted to (i) provide a first prioritized list of the auxiliary equipment to load on said processing tool based on a list of said auxiliary equipment absent from said processing tool; and (ii) provide a second prioritized list of said auxiliary equipment to remove from said processing tool.

21. The system of claim 20, wherein said processing tool comprises a photolithographic system.

22. The system of claim 21, wherein said auxiliary equipment comprises a reticle.

23. The system of claim 20, wherein said plurality of workpieces comprise semiconductor wafers.

24. The system of claim 20, wherein said characteristics associated with said plurality of workpieces comprise work lot priorities, processing times, auxiliary equipment handling system bandwidth, lot priorities of forecasted lots, and pod availability.

25. The system of claim 20, wherein said analyzer is configured for ranking said workpieces in terms of expected arrival times to said processing tool.

26. The system of claim 20, further comprising a modeling generator configured for modeling future events related to said processing tool based on work-in-process projections generated from said analyzer.

27. The system of claim 20, wherein said first prioritized list is created by:
    creating a dispatchable workpiece lot list;
    creating a work-in-process (WIP) projection report;
    prioritizing said WIP projection report;
    merging said dispatchable workpiece lot list and said WIP projection report into a single list;
    removing said auxiliary equipment currently allocated to said processing tool from said single list;
    removing inhibited and unavailable auxiliary equipment from said single list; and
    joining corresponding wafer lot information of auxiliary equipment associated with workpiece lots in either said dispatchable workpiece lot list or said WIP projection report to said single list.

28. The system of claim 20, wherein said first prioritized list is created by:
    creating a removal list of auxiliary equipment that is currently on said processing tool;
    removing, from said removal list, auxiliary equipment associated with workpiece lots in a work-in-process (WIP) projection report;
    removing, from said removal list, said auxiliary equipment that are on said WIP projection report;
    removing, from said removal list, said auxiliary equipment that are on a dispatchable workpiece lot list; and
    prioritizing said removal list based on the last usage of said auxiliary equipment and on workpiece lots on hold.

29. A program storage device readable by computer, tangibly embodying a program of instructions executable by said computer to perform a method of controlling a manufacturing system, said method comprising:
    providing at least one processing tool and auxiliary equipment;
    providing a first prioritized list of the auxiliary equipment to load on said at least one processing tool based on a list of said auxiliary equipment absent from said at least one processing tool;
    providing a second prioritized list of said auxiliary equipment to remove from said at least one processing tool;
    supplying a plurality of workpieces to be processed on said at least one processing tool; and
    determining, from characteristics associated with said at least one processing tool and said plurality of workpieces, an order of arrival of said auxiliary equipment to arrive at said at least one processing tool.

30. The program storage device of claim 29, wherein in said providing, said at least one processing tool comprises a photolithographic system.

31. The program storage device of claim 30, wherein in said providing, said auxiliary equipment comprises a reticle.

32. The program storage device of claim 29, wherein in said supplying, said plurality of workpieces comprise semiconductor wafers.

33. The program storage device of claim 29, wherein said characteristics associated with said plurality of workpieces comprise work lot priorities, processing times, auxiliary equipment handling system bandwidth lot priorities of forecasted lots, and pod availability.

34. The program storage device of claim 29, wherein said determining comprises ranking said workpieces in terms of expected arrival times to said at least one processing tool.

35. The program storage device of claim 29, wherein said method further comprises modeling future events related to said at least one processing tool based on work-in-process projections.

36. The program storage device of claim 29, wherein in said method, the process of providing said first prioritized list comprises:
    creating a dispatchable workpiece lot list;
    creating a work-in-process (WIP) projection report;
    prioritizing said WIP projection report;
    merging said dispatchable workpiece lot list and said WIP projection report into a single list;
    removing said auxiliary equipment currently allocated to said at least one processing tool from said single list;
    removing inhibited and unavailable auxiliary equipment from said single list; and
    joining corresponding wafer lot information of auxiliary equipment associated with workpiece lots in either said dispatchable wafer lot list or said WIP projection report to said single list.

37. The program storage device of claim 29, wherein in said method, the process of providing said second prioritized list comprises:
    creating a removal list of auxiliary equipment that is currently on said at least one processing tool;
    removing, from said removal list auxiliary equipment associated with workpiece lots in a work-in-process (WIP) projection report;
    removing, from said removal list, said auxiliary equipment that are on said WIP projection report;
    removing, from said removal list, said auxiliary equipment that are on a dispatchable workpiece lot list; and
    prioritizing said removal list based on the last usage of said auxiliary equipment and on workpiece lots on hold.

* * * * *

UNITED STATES PATENT AND TRADEMARK OFFICE
CERTIFICATE OF CORRECTION

PATENT NO.         : 7,206,652 B2
APPLICATION NO. : 10/711079
DATED              : April 17, 2007
INVENTOR(S)        : Burda et al.

It is certified that error appears in the above-identified patent and that said Letters Patent is hereby corrected as shown below:

On the Title Page, Item (75)
Add Inventor Sanjay Hedge, S. Burlington, VT.

Signed and Sealed this

Twenty-seventh Day of November, 2007

JON W. DUDAS
*Director of the United States Patent and Trademark Office*